United States Patent [19]

Normile et al.

[11] Patent Number: 5,543,718

[45] Date of Patent: Aug. 6, 1996

[54] CABLE TESTING DEVICE

[75] Inventors: James M. Normile, Hayward; Jared M. McGowan, Boulder Creek; Andrew King, Tracy, all of Calif.

[73] Assignee: DCM Industries, Inc., Union City, Calif.

[21] Appl. No.: 225,128

[22] Filed: Apr. 8, 1994

[51] Int. Cl.⁶ ..................................................... H01H 31/02
[52] U.S. Cl. .......................... 324/539; 324/551; 324/754; 324/761
[58] Field of Search ......................... 29/749, 755; 324/66, 324/72.5, 149, 538, 539, 541, 551, 754, 758, 761, 762; 439/482, 626, 912

[56] References Cited

U.S. PATENT DOCUMENTS

| | | | |
|---|---|---|---|
| 4,038,501 | 7/1977 | Volk | 324/66 |
| 4,160,947 | 7/1979 | Tanno et al. | 324/538 |
| 4,575,588 | 3/1986 | Vande Vyver | 324/66 |
| 4,698,585 | 10/1987 | Herman et al. | 324/66 |
| 4,794,339 | 12/1988 | LeNir et al. | 324/66 |
| 4,928,066 | 5/1990 | Adlon et al. | 324/539 |

Primary Examiner—Kenneth A. Wieder
Assistant Examiner—Christopher M. Tobin
Attorney, Agent, or Firm—Glen R. Grunewald

[57] ABSTRACT

A device for testing pairs of wires in a cable which includes a testing console having known means for performing tests on the wires and having a test fixture with a plurality of pins extending through a mating surface, the pins being arranged and arrayed to enter holes containing wires to by tested in a terminal fixture, the terminal fixture having holes into which wires may be inserted and held by friction, the holes opening in a terminal fixture having the holes in the same array as the array of pins in the test fixture so that when the terminal fixture and the test fixture are brought together with the same orientation the pins extending from the test fixture enter the holes in the terminal fixture and make a circuit between the testing console and the wire, and the console includes a rotating switch arrangement to bring both ends of each wire into circuit with testing equipment consecutively and one-at-a-time.

4 Claims, 7 Drawing Sheets

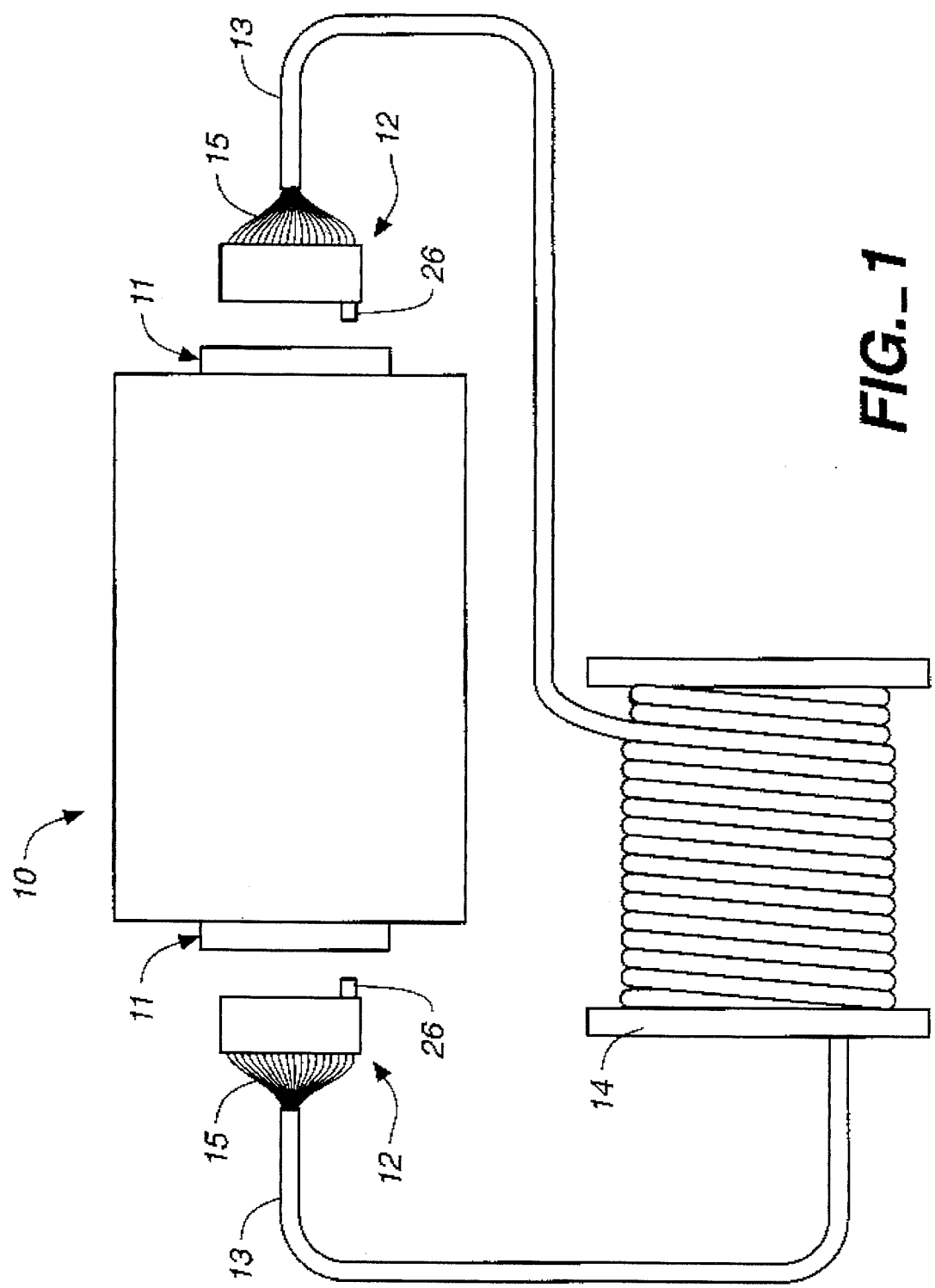
FIG._1

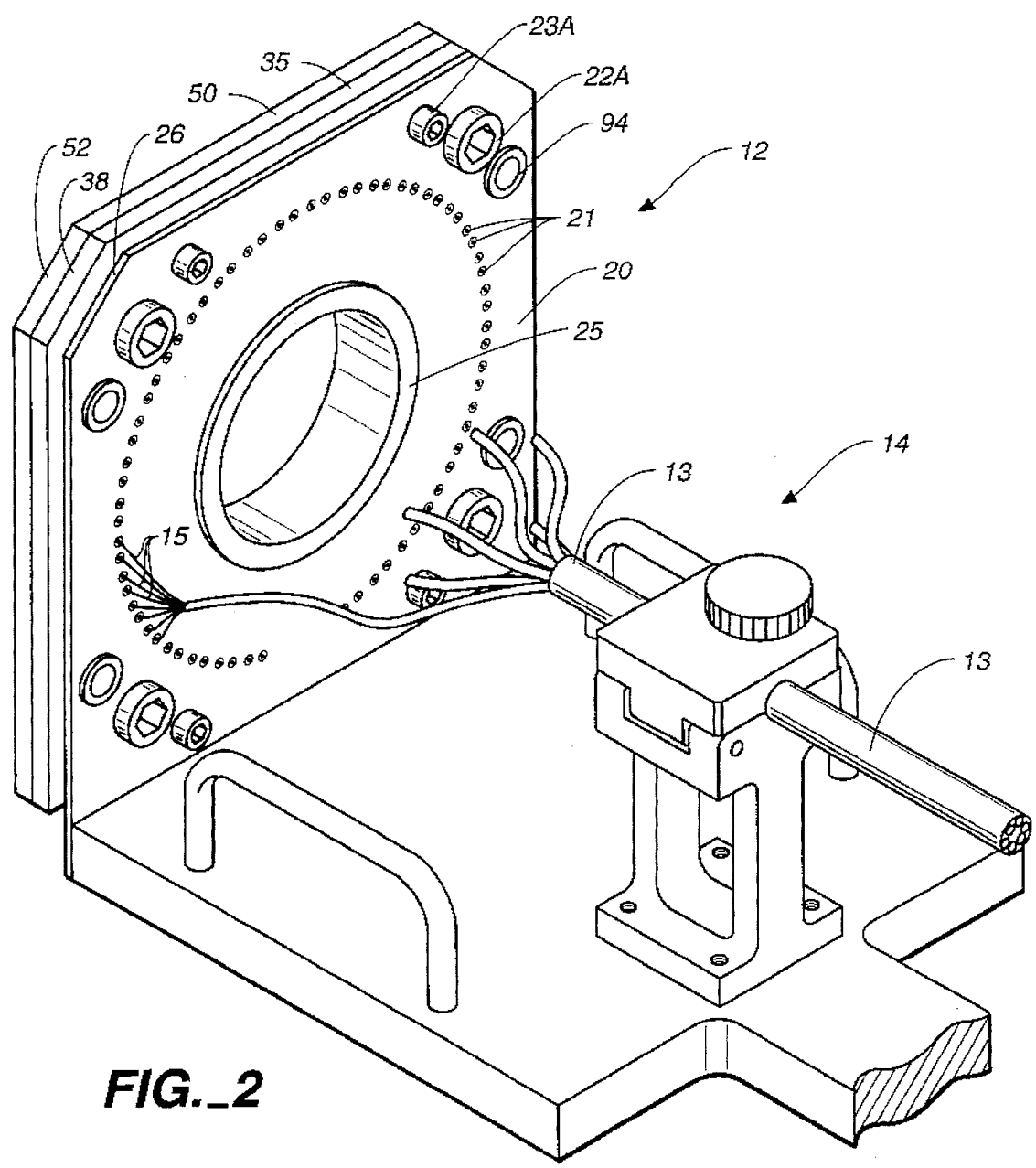
FIG._2

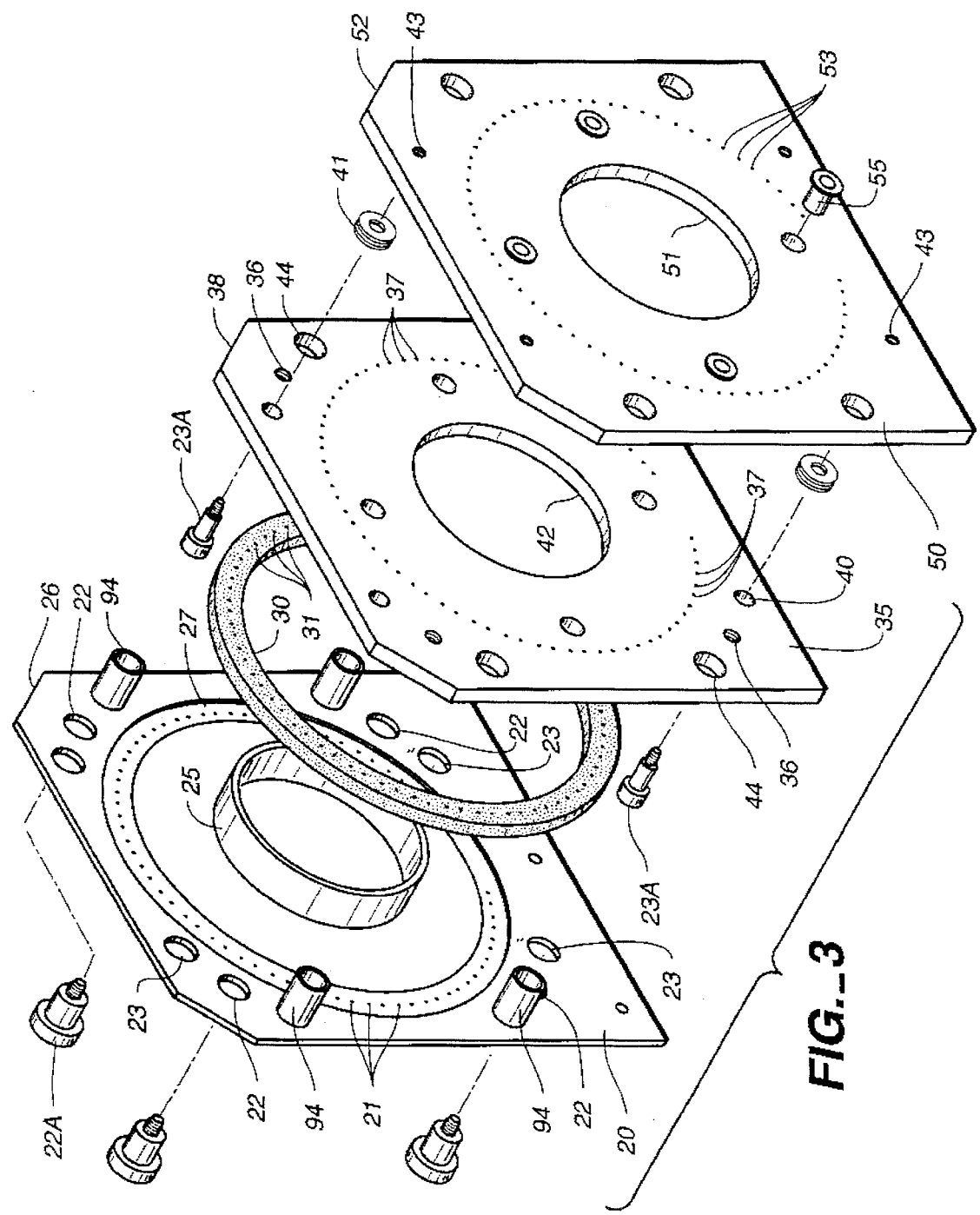
FIG._3

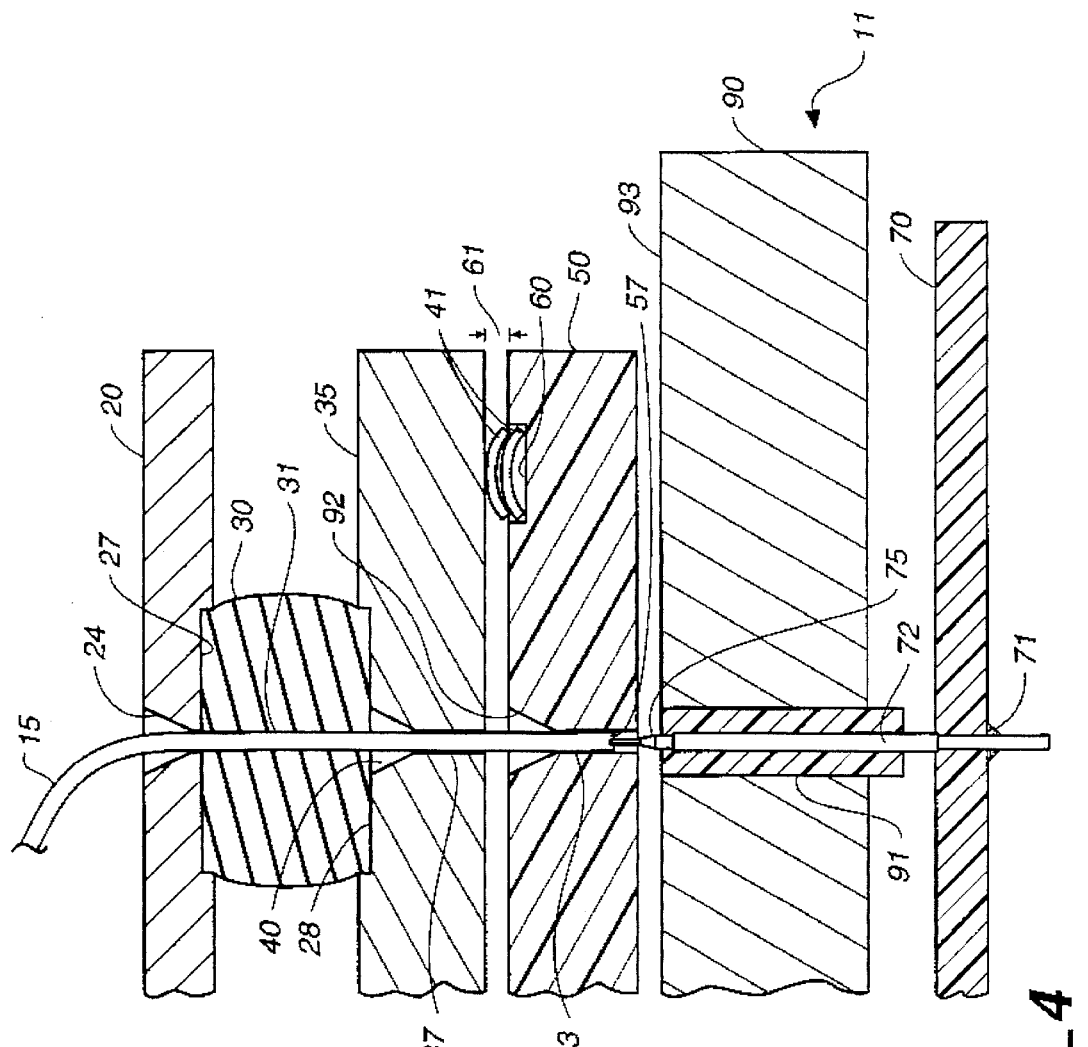
FIG._4

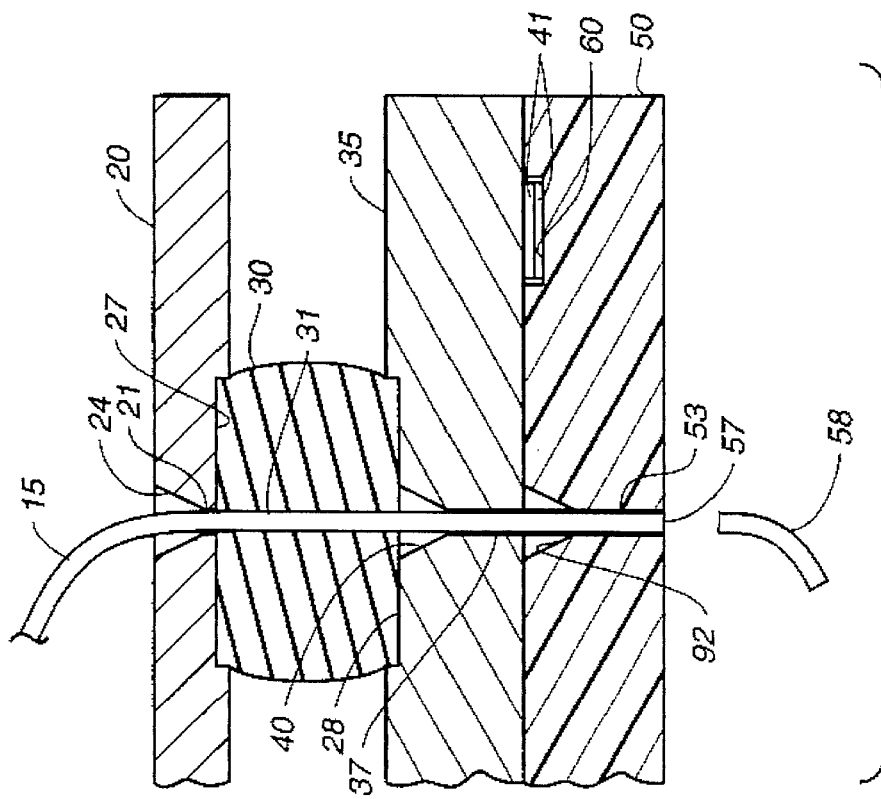
*FIG._6*
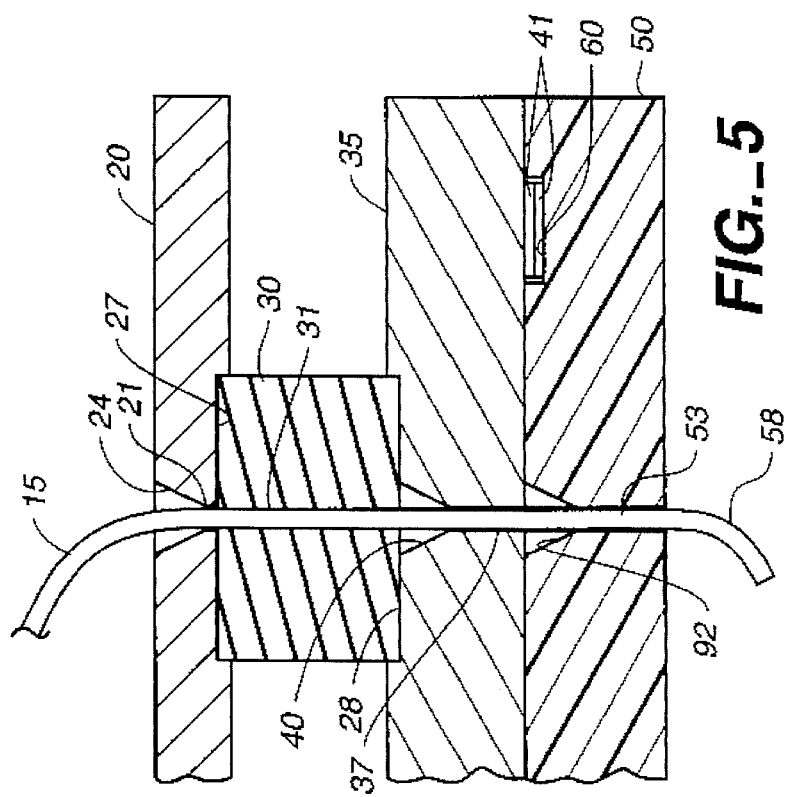
*FIG._5*

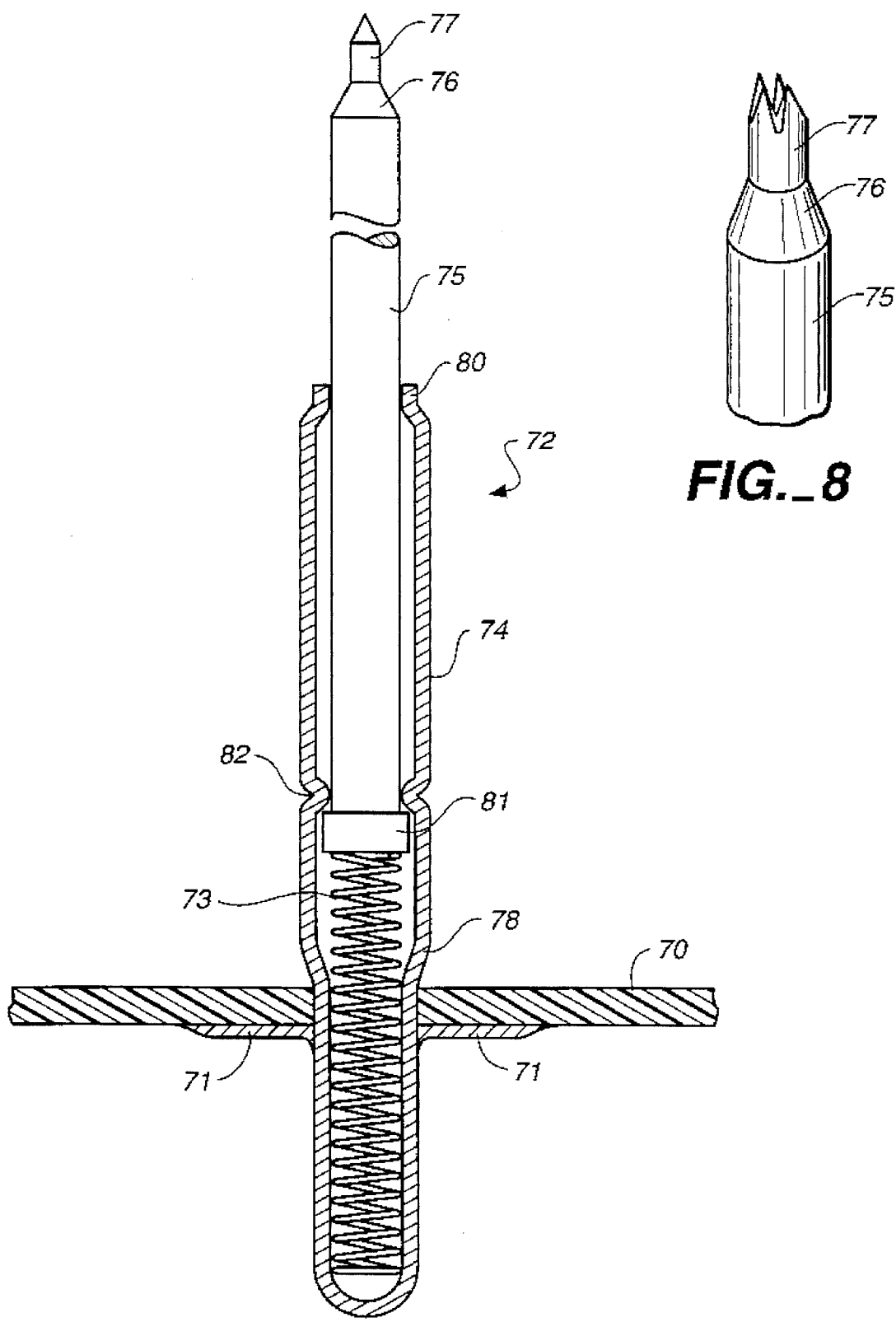
FIG._7
FIG._8

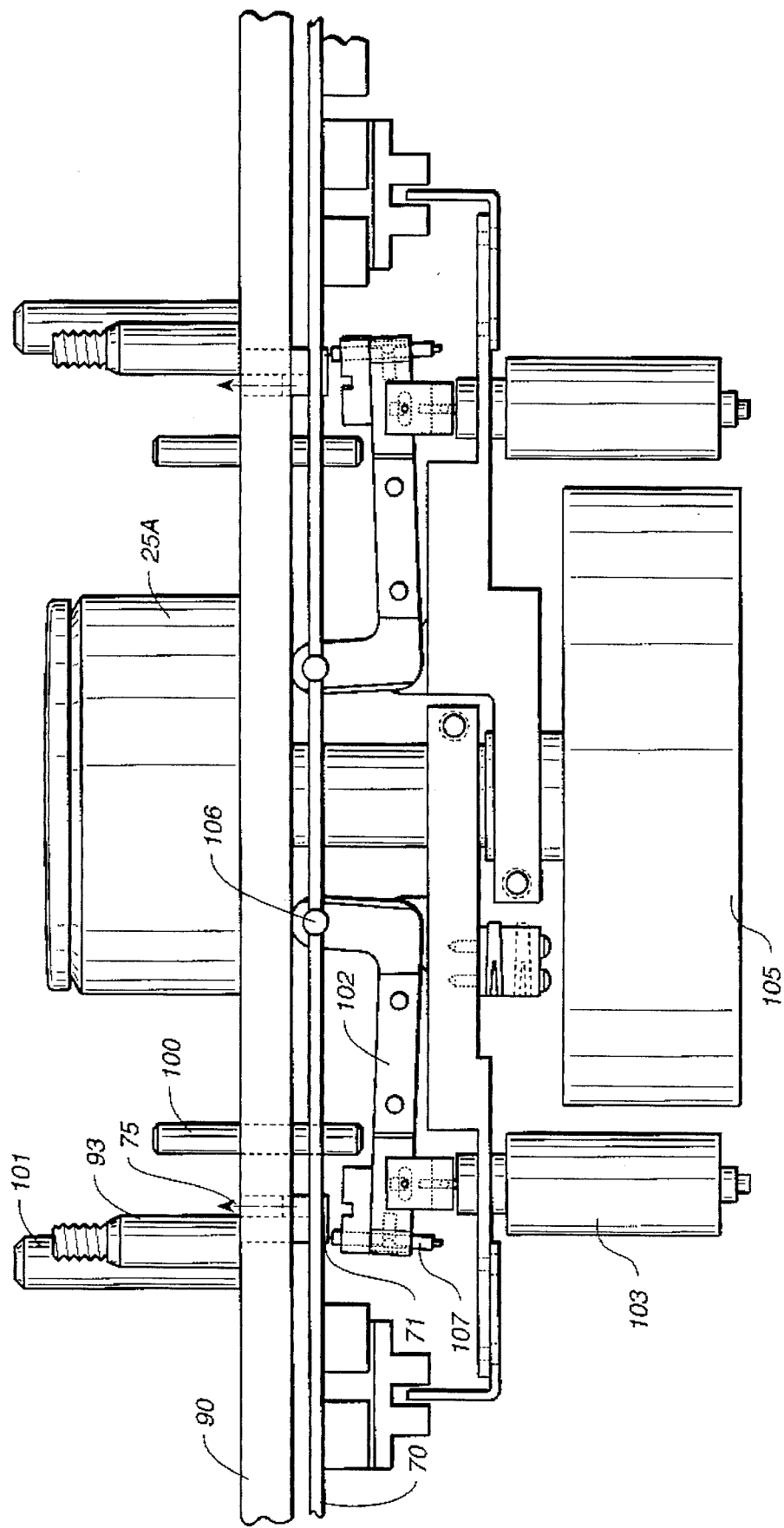
FIG._9

CABLE TESTING DEVICE

TECHNICAL FIELD

This invention is in the field of testing electrically conductive cables made of pairs of twisted wires for their adequacy in communications, such as in telephone systems, intercom systems and communication between or among computers.

BACKGROUND ART

In telephone systems pairs of twisted wires are enclosed in cables carrying many pairs of such wires. Each twisted pair is color-coded or otherwise coded to identify both ends of the same wire at each end of the cable. Long lengths of such cable are wound on spools for shipment and storage.

It is desirable to test each twisted pair of wires in a spool of cable before the spool is shipped to a customer. Testing not only is needed to find discontinuities in a wire but also to determine whether the electrical-carrying ability of the wire is interfered with by induction or other interference caused by adjacent wires. The wire pairs must be tested after manufacture of the cable is completed to ensure that defects caused by manufacture of the cable or the electrical characteristics of adjacent pairs of wires will be found before the cables are shipped to customers.

Present devices for testing cables of twisted pairs of wire require individually stripping wire ends or piercing insulation of each wire and connecting it electrically to a testing console that contains test elements for those electrical characteristics of the cable that are of interest. Some cables carry a few wires while others carry many—sometimes fifty pairs of wire, or more. Connecting wires to a console is time-consuming and during the time that the wires are being prepared for and connected to the testing console, the console cannot be used to test other cables. Presently-used testing devices also require elaborate switching means to bring the wires being tested in circuit with elements of the testing console. As a result, testing spools of cable is a time-consuming procedure that is sensitive to different electrical connections between the ends of the wires in the cable and the testing device. Also, the testing procedure requires multiple-switching means to bring each wire in circuit with the testing means, which introduces the different characteristics of the different switches into the testing circuit and which adds expense to the testing device and the procedure for using it.

DISCLOSURE OF THE INVENTION

This invention is a device that greatly mitigates the problems associated with prior cable testing devices. The device of this invention includes a testing console in circuit with two test fixtures that are normally a part of the testing console. The test fixtures are made so that each may be connected to an opposite end of a cable of multiple twisted wire pairs through two terminal fixtures—connected one to each end of the cable being tested. Each terminal fixture has a mating surface that matches a mating surface on one of the test fixtures. The terminal fixtures have a plurality of holes passing through them and through the mating surface, each hole having a diameter to receive one wire of a twisted-wire pair. A terminal fixture to test a cable having 25 pairs of wires will have at least 50 holes through the fixture and through the mating surface of the fixture.

Each terminal fixture has an orienting configuration which interconnects with a co-acting orienting configuration on a test fixture to be described hereinafter. It is also desirable for these orienting configurations to have both ends of a wire of a wire pair similarly located in their terminal fixtures with respect to the other terminal fixture that is used. The orienting configuration may be one or more tongues to be received in appropriately shaped slots, one or more pins to be received in bored holes, rails, edge configurations, or the like.

The device of this invention also includes a test console which has known elements to test wires in a cable. The console includes two test fixtures which are connectable to the terminal fixtures. Each test fixture includes a plurality of retractable and extendable pins in an array that matches the array of holes in the mating surface of each terminal fixture. Each test fixture also includes an orienting contour which co-acts with the orienting contour of each terminal fixture to provide a unique position with respect to the array of holes in the terminal fixture and the array of pins in the test fixture.

The pins are dimensioned to fit into the holes in the terminal fixture and preferably are axially biased to be driven into the holes. The pins have an end with a diameter that fits into the holes in the terminal fixtures, preferably with the end of each pin provided with one or more points to improve penetration of a cut wire-end fixed in the terminal fixture.

In use, the color- or otherwise-coded twisted wire pairs are installed in the holes of one terminal fixture in a position with respect to the orienting contour that is unique to that pair of wires. The wires are held by a friction element in the holes in the terminal fixture, and the ends are cut square to be flush with the mating surface and preferably then recessed from the mating surface. The other ends of the wire pair are installed in the second terminal fixture in the same way and in holes having the same orientation with respect to the orienting contour of the first terminal fixture.

Two terminal fixtures may then be connected, one each, to the two test fixtures on the test console with the orientation contours appropriately engaged. When a close connection is made between the two test fixtures and the two terminal fixtures, the pins of the test fixtures will enter the holes of the terminal fixtures, will penetrate the cut ends of the wires in the holes to make an electrical contact through the open ends of the wires, and will be in a circuit with the test equipment within the console. A single rotary switching device may then bring the wires so-connected into the test circuit consecutively.

The invention includes rotary switch means which permits each pair of wires to be put into the testing circuit one pair at a time using a single switch means. In a preferred embodiment of the invention the pins of the test fixture are set in a printed circuit board so that when the test fixtures and the terminal fixtures are correctly oriented with respect to each other the pins are driven into electrical contact with the wire ends by moving the terminal fixtures toward the test fixtures. When the points of the pins contact the wire ends, the portion of the pins connected to the circuit board may be brought into the test circuit by a single-switch means that moves probes to bear against electrical conducting elements in circuit with the pins. In this invention a single-switch means is rotated to have a conducting element aligned with the two pins at opposite ends of the wire being tested, after which a solenoid plunger, or the like, forces the conducting element into a circuit with that part of each pin embedded in the printed circuit board.

Among the advantages of the invention are that no time-consuming stripping or piercing of insulation is required, that the electrical connections between the pins and the ends of the wire are uniform and predictable, that testing of a spool of cable need not be delayed by the time spent in stripping or otherwise preparing wire ends and connecting them to the console A cable to be tested may have its terminal fixtures connected to cable wires while one or more other cables that were previously connected to terminal fixtures are tested. A single switching means can be used to bring all wires being tested into circuit with the test equipment. In other words, in the device of this invention a separate switch is not needed for each wire pair to be tested. Another advantage is that installation of the ends of wire pairs in the terminal fixture is very rapid and very reproducible, usually involving just inserting the end of each wire into a hole, cutting the ends of the wires flush with the mating surface of the terminal fixture, and recessing of the wire ends a preselected distance into the terminal fixture by the use of spring washers, or the like, to move a spacer plate.

BRIEF DESCRIPTION OF THE DRAWINGS

FIG. 1 is a schematic representation of a device embodying this invention arranged to test a length of cable.

FIG. 2 is a perspective view of the back of a terminal fixture—i.e., the side opposite a mating surface.

FIG. 3 is an exploded perspective view of a terminal fixture useful in a device embodying this invention.

FIG. 4 is a partial cross section of a terminal fixture and a test fixture in operational relationship with one another.

FIG. 5 is a partial schematic cross section of a terminal fixture in the process of having a wire installed in it.

FIG. 6 is the fixture of FIG. 5 with the wire installed.

FIG. 7 is a cross section of a pin assembly useful in the device of this invention.

FIG. 8 is a partial enlarged view of the pin used in the assembly of FIG. 7.

FIG. 9 is a view of a juxtaposed terminal fixture and test fixture using a solenoid plunger-driven switching means.

BEST MODE FOR CARRYING OUT THE INVENTION

FIG. 1 is a schematic showing the major elements of the device of this invention and their relationship to one another. A console, generally designated 10, includes the elements necessary to test the cable 13. The console 10 is provided with two test fixtures, generally designated 11. Terminal fixtures, generally designated 12, connect the wires 15 contained in cable 13 to the terminal fixture in a manner that permits them to be tested as will be described hereinbelow. The cable 13 may be wound on a spool 14 to have both ends of the cable 13 accessible for testing. The terminal fixtures 12 are provided with orienting configurations shown schematically as 26. Although not shown, the test fixtures 11 are also provided with co-acting orienting configurations as will be explained in more detail hereinbelow.

FIG. 2 shows terminal fixture 12 from the side opposite the mating surface. A holding bracket generally shown as 14 has means for clamping cable 13 so that wires 15 can be inserted in holes 21.

The terminal fixture 12 is illustrated in exploded view in FIG. 3. It comprises a first plate 20 that is provided with wire-receiving holes 21. The first plate 20 is provided with four compression-bolt holes 22 for holding first plate 20 to second plate 35 and to compress a rubber compression element 30 between them. Compression bolts 22A are used for that purpose. First plate 20 is also provided with compression-bolt holes 23 that are used to hold the second plate 35 and third plate 50 together as will be discussed hereinbelow. Each of the wire-receiving holes 21 is provided with an expanded inlet 24 as best illustrated in FIGS. 5 and 6 to aid the insertion of wires 15. Plate 20 also includes an alignment flange 25 that is dimensioned to be snugly received in hole 42 in second plate 35 and in hole 51 in third plate or end plate 50. First plate 20 includes a beveled edge 26 which may be employed as an orienting configuration.

The rubber compression element 30 is provided with wire-receiving holes 31. Rubber compression element 30 is positioned against first plate 20 in a recess 27 so that the holes 21 and the holes 31 are aligned.

A second plate 35 is provided with compression-bolt holes 36 which are aligned with compression-bolt holes 22. Holes 36 are threaded so that the plates 20 and 35 can be drawn together with bolt 22A. When plates 20 and 35 are drawn together, the rubber compression element 30 is compressed so that wire-receiving holes 31 tend to become smaller in diameter thereby holding wires 15 tightly by friction with the compressed rubber.

Second plate 35 also is provided with wire-receiving holes 37 which, in the final assembly, are aligned with holes 21 and 31. Second plate 35 is also provided with beveled edges 38 which may act as orienting contours. Each of the holes 37 has an expanded inlet 40, as best shown in FIGS. 4, 5 and 6, to guide the wires 15 into the wire-receiving holes 37.

Spring washers 41 are positioned between plate 35 and end plate 50 and, as is best seen in FIGS. 4, 5 and 6, they are positioned in recesses 60 in the face of plate 50. Plate 35 is also provided with compression-bolt holes 44 which, in assembled condition, are aligned with compression-bolt holes 43 in plate 50 so that tightening a bolt 23A draws plates 35 and 50 together to cause spring washers 41 to be compressed and to lie flat in recesses 60 as shown in FIGS. 5 and 6. Plate 50 has beveled edges 52 which may act as orienting contours and wire-receiving holes 53 which are aligned with wire-receiving holes 37 in plate 35 and are provided with expanded inlets 92 as illustrated in FIGS. 4, 5 and 6.

FIG. 4 shows the elements of the exploded view of FIG. 3 in their assembled arrangement with one another. FIGS. 5 and 6 illustrate the procedure for assembling wires 15 to terminal fixture 12. FIG. 5 shows a wire 15 threaded through wire-receiving holes 21, 31, 37 and 53. Threading wire 15 through the holes is facilitated by the expanded ends 24, 40 and 92. The compression element 30 has no expanded wire inlets. Prior to inserting wires, the bolts 23A are tightened to draw plates 35 and 50 closely in contact with each other, thereby compressing spring washers 41 within cavity 60 so that they are flat. The wire 15 is threaded through all of the wire-receiving holes and it is pushed completely through the assembly until an end 58 of indeterminate length protrudes from the wire-receiving hole 53. The compression bolts 22A holding plates 20 and 35 together are not tightened, whereby the wire 15 can slide through wire-receiving hole 31 readily. When the end 58 protrudes sufficiently from plate 50, the plates 20 and 35 are drawn together to compress rubber element 30, to create high friction between wire 15 and the wire-receiving hole 31. At that point the protruding portion 58 of each wire will be clipped off to make wire end 57 flush with the bottom surface of plate 50, after which the bolts 23A holding plates 35 and 50 are loosened and the spring washers 41 are permitted to expand to create a space 61 between plates 35 and 50 (See FIG. 4). Separation of plates 35 and 50 draws the end 57 of wire 15 back into the wire-receiving hole 53 so that it is protected from physical harm and so that it cannot fray when it is brought into contact with a circuit-closing pin to be described below.

FIG. 4 shows the assembled terminal fixture with wire 15 held by rubber compression element 30 and recessed slightly within the hole 53. Test fixture 11 is made of a jig plate 90 having a teflon-lined hole 91 in which a pin assembly 72 is embedded. The upper surface 93 of the jig plate 90, as shown in FIG. 4, is the mating surface of test fixture 11. FIG. 7 is an enlarged view of the pin assembly 72 which is soldered to a printed circuit board 70 with solder 71. The pin assembly 72 includes barrel 74. A spring 73 is contained within the barrel 74, and the pin 75 is dimensioned to slide into barrel 74 where it is biased toward extending out of the socket by spring 73. Pin 75 has a conical tapered portion 76 that terminates in a shape adapted to make good electric contact with the cut end 57 of a wire 15. The end of the pin may be simply pointed, but in a preferred embodiment it is provided with a number of points in the general shape of a crown as illustrated in FIG. 8.

The pin 75 has an expanded collar 81 which is held by indentation 82, and a swaged portion 80 keeps pin 75 concentric with barrel 74. The pin assembly 72 is shown in FIG. 4 embedded in the teflon-lined hole 91 so that its end penetrates the printed circuit board and is in circuit with it by way of the soldered connection 71. The pin shaft 75 is biased into hole 53 until it contacts the wire-end 57 where the conductive material of the pin shaft 75 makes an electrical circuit between the wire 15 and the printed circuit board 70.

FIG. 9 illustrates the essential elements of a rotary switch useful for bringing wire contacts quickly into a testing circuit. A jig plate 90 is provided with a rough guide-pin 101 and a precision guide-pin 100, both of which coact with holes in the terminal fixture used in conjunction with the illustrated test fixture. Rough guide-pin 101 enters a hole in terminal fixture 12 and guides the terminal fixture to enter a closer-fitting hole in the terminal fixture which, in turn, positions holes 53 precisely in alignment with pins 75.

In the illustrated embodiment the printed circuit board 70 has a soldered connection 71 between the end of each pin assembly 72 and an electric contact point on the printed circuit board. The rotary switch device employs a rotating and positioning means generally shown as 105, to which pivoted arms 102 are connected through pivots 106. Solenoid plungers 103 are on the rotating switching assembly and they are illustrated in their expanded positions driving pivoted arms 102 upwardly so that conductive probes 107 contact the printed circuit board at positions to put the pins 75 in circuit with the conductive probes 107. Conductive probes 107 are in contact with soldered connection 71, a circuit between two pins 75 is created between the two ends of the same wire. When the test of the wires is completed, solenoid plungers 103 retract so that the pivoted arms move away from the circuit board 70 and probes 107 move out of contact with soldered connection 71, after which rotating and positioning means 105 rotates and positions probes 107 to be aligned with that portion of the printed circuit board that is in circuit with another pin 75, usually but not necessarily the next consecutive pin 75 in the array connected to the circuit board. This rotary switch means moves quickly and accurately to bring consecutive pins into circuit with the testing means, and it employs two solenoid plungers for testing all wires 15 rather than separate switching devices for each wire or wire pair as in the prior art.

We claim:

1. A device for testing a plurality of insulated wires contained within a length of cable, comprising:

a console comprising wire testing means, a first test fixture, a second test fixture, and means to put said first test fixture and said second test fixture in circuit with said testing means, said first test fixture and said second test fixture each comprising:

a first mating surface, a plurality of axially movable and biased pins extending through said first mating surface in a predetermined array, a first orienting configuration having a fixed spacial relationship with the axes of said pins, a first terminal fixture and a second terminal fixture, each comprising:

a second mating surface, a plurality of wire-receiving channels passing through said second terminal fixture and opening in said second mating surface, the openings in said second mating surface being in said predetermined array, wire-holding means associated with each wire-receiving channel, a second orienting configuration shaped to coact with said first orienting configuration to hold each test fixture in a unique orientation with a terminal fixture, said unique orientation positioning specific pins in specific channels when said second mating surface of said terminal fixture is juxtaposed with said second mating surface of said test fixture.

2. The device of claim 1 wherein said holding means comprises a compressible rubber member.

3. The device of claim 1 wherein said terminal fixture comprises a first plate, a second plate and a third plate, said rubber member positioned between said first plate and said second plate, means to compress said rubber member between said first plate and said second plate, spring means positioned between said second plate and said third plate and releasable means to compress said spring means, whereby said third plate comprises said terminal fixture mating surface.

4. The device of claim 1 wherein said means to put said first terminal fixture and said second terminal fixture in circuit comprises a rotary electric contact means including means to position contact probes adjacent pairs of said biased pins and means to move said contact probes into electrical contact with said pairs of biased pins.

\* \* \* \* \*